United States Patent [19]

Hill

[11] 4,445,043

[45] Apr. 24, 1984

[54] METHOD OF MAKING AN OPTOCOUPLER

[75] Inventor: Lawrence R. Hill, Mesa, Ariz.

[73] Assignee: General Instrument Corporation, New York, N.Y.

[21] Appl. No.: 343,430

[22] Filed: Jan. 28, 1982

[51] Int. Cl.³ ............................................ G06K 7/015
[52] U.S. Cl. ........................................ 250/557; 29/593
[58] Field of Search ................ 29/55, 56, 593, 569 L, 29/572; 357/19; 324/158 F; 250/557, 551; 209/571

[56] References Cited

U.S. PATENT DOCUMENTS 3,724,068  4/1973  Galli .................................... 25/593
3,984,620  10/1976  Rubillard et al. .............. 324/158 F Primary Examiner—David C. Nelms
Assistant Examiner—E. Austin, II
Attorney, Agent, or Firm—Barry R. Lipsitz

[57] ABSTRACT

A process for manufacturing optocouplers having an emitter element properly oriented with respect to a receiver element. An emitter element is fastened to an emitter carrier. A receiver element is fastened to a receiver carrier. The emitter and receiver carriers are positioned adjacent one another to bring the emitter and receiver elements into operative relation. The combined operation of the emitter and receiver elements is electrically monitored while the position of the carriers with respect to one another is adjusted. On the basis of the electrical monitoring, a determination is made as to when a proper orientation between the emitter and receiver elements has been achieved. The emitter and receiver carriers may then be permanently bonded together for subsequent final packaging. The process described is particularly well suited to automated manufacturing.

11 Claims, 8 Drawing Figures

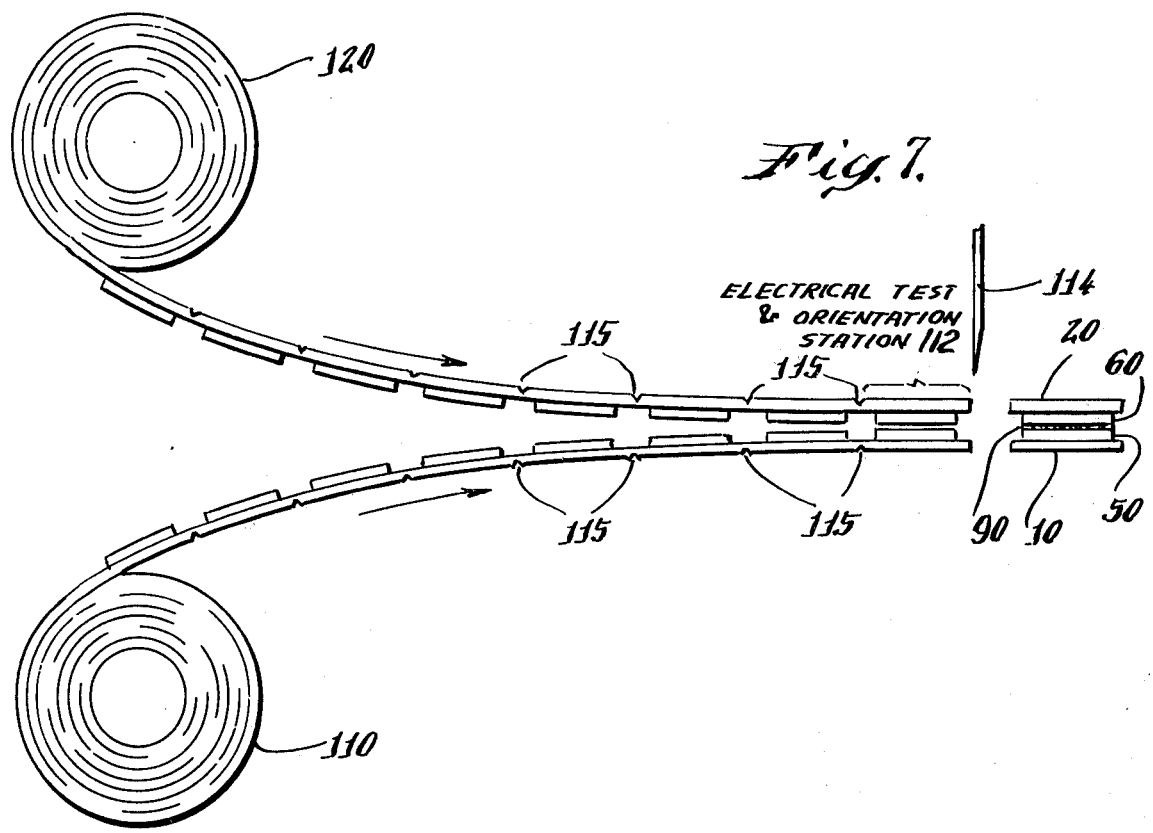
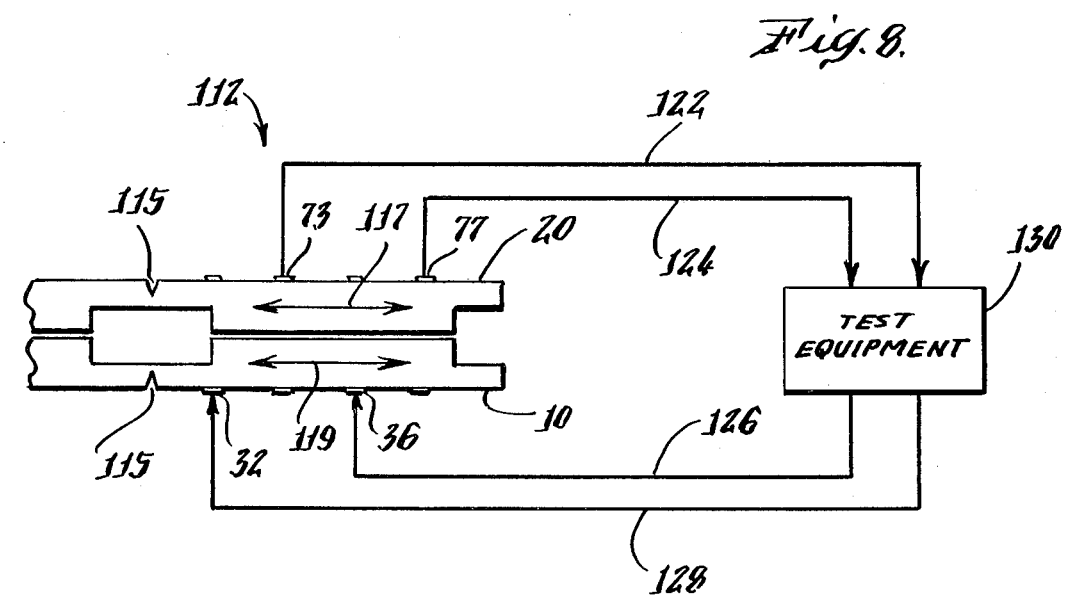

METHOD OF MAKING AN OPTOCOUPLER

BACKGROUND OF THE INVENTION

This invention relates to optocouplers and more particularly to a method of manufacturing optocouplers wherein the electrical performance thereof is monitored and optimized prior to final assembly.

Optocouplers are electronic components which transmit electrical information, without electrical connection, between a light source (emitter) and a light detector (receiver). The light emitted can be either invisible (e.g., infrared), or can be light in the visible spectrum. An input signal to the optocoupler causes the light source to turn on. When this happens, the light detector senses the light from the source, and produces an input signal proportional thereto. In this manner, the output signal follows the input signal without the need for any direct electrical connection between the input and output of the optocoupler. The input is coupled to the output optically rather than electrically; hence, the name optocoupler.

In order for an optocoupler to operate properly, the light source and light detector must be oriented properly with respect to each other. If too little light reaches the detector, then device sensitivity suffers. If too much light reaches the dectector, then device speed suffers because saturation of the phototransitor on the detector reduces its switching speed.

In the prior art, optocouplers have been manufactured by gluing a carrier containing a separate light source or plurality of light sources together with a carrier containing a light detector or plurality of detectors. After the carrier containing light sources and detectors are permanently secured to one another, the optocoupler is tested to determine whether it meets the electrical specifications for which it was designed.

In manufacturing optocouplers as described above, there is no precise control over the final orientation of the light source and light detector with respect to one another. Furthermore, the electrical connections made to the light source and light detector are not available for testing purposes until after the manufacture of the optocoupler is complete. This is due to the fact that in assembling optocouplers, an element known as a lead frame is used to form the leads through which electrical connections to the complete optocoupler can be made. A lead frame comprises a plurality of individual lead members that are tied together in a metal frame. All of the leads are electrically shorted together when they are in the lead frame. Free ends of the lead members are connected through delicate wires to proper points on the semiconductor light source and detector. The lead members are severed from the rest of the lead frame, and hence from one another, during a final step in the optocoupler packaging process. Since the individual leads are electrically shorted together until this final step, it is impossible to electrically test the optocoupler at any time prior to this step.

Once the package has been assembled and severed from the lead frame, it is too late to make any adjustment to the oricntation between the light source and light detector.

It would be advantageous to provide a method for manufacturing optocouplers wherein the orientation between the light sourcc and light detector can be adjusted prior to final assembly of the package containing the light source and light detector. In this way, the electrical characteristics of the optocoupler could be optimized during a continuous, automated manufacturing process.

SUMMARY OF THE INVENTION

In accordance with the present invention, a process is provided for manufacturing an optocoupler having an emitter element properly oriented with respect to a receiver element. An emitter element is fastened to an emitter carrier. A receiver element is fastened to a receiver carrier. The emitter and receiver carriers are positioned adjacent one another to bring the emitter and receiver elements into operative relation. The combined operation of the emitter and receiver elements is then electrically monitored while the position of the carriers with respect to one another is adjusted. On the basis of the electrical monitoring, a determination is made as to when a proper orientation between the emitter and receiver elements has been achieved.

DESCRIPTION OF THE DRAWINGS

FIG. 7 is a schematic view of an automated assembly line for manufacturing optocouplers in accordance with the present invention;

FIG. 8 is a schematic view of the electrical test and orientation station of FIG. 7.

DETAILED DESCRIPTION OF THE INVENTION

The present invention provides an optocoupler assembly technique which allows electrical testing and chip placement optimization of an optocoupler prior to final packaging. These advantages are provided by using unique chip carriers for the emitter and receiver portions of the optocoupler. The carriers each contain a plurality of pins extending therethrough, to which connections to the receiver or emitter chip may be made from the inside while providing electrical test points on the outside of the carrier. The emitter and receiver carriers may be adjusted with respect to one another while the emitter and receiver elements are undergoing electrical tests, before the carriers are glued together.

Figure 1:
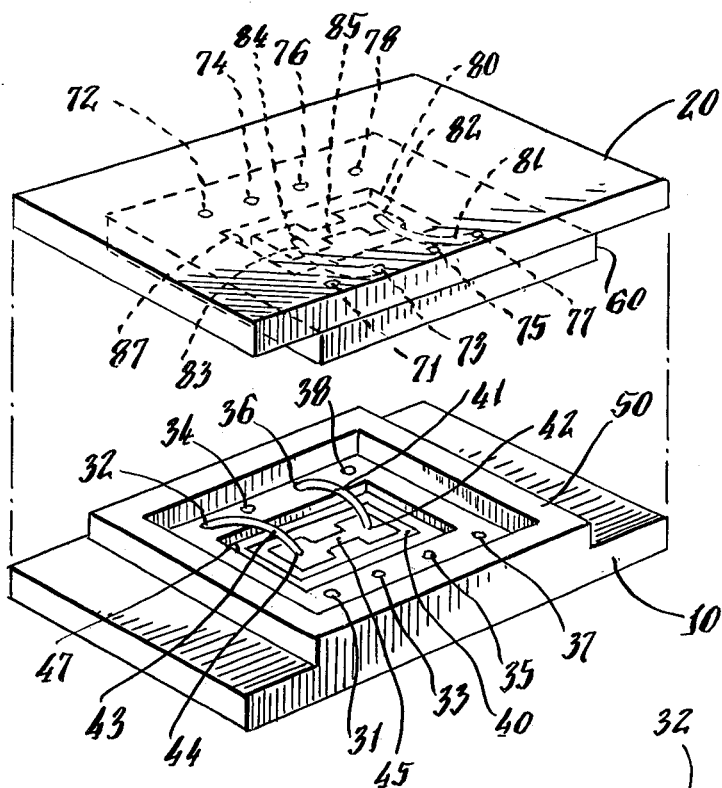
FIG. 1 is an exploded perspective view of a pair of chip carriers in accordance with the present invention.

Turning now to the drawings, FIG. 1 shows receiver carrier 10 and emitter carrier 20 with receiver chip 40 and emitter chip 80 in generally face to face relation. Carriers 10 and 20 are preferably molded and/or extruded from a suitable compound, such as a thermoplastic or a thermosetting compound. Examples of thermoplastics which can be used are those marketed under the trademarks "RYTON", a polyphenylene sulfide made by Phillips Petroleum Corporation and "LEXON" made by General Electric Corporation. Examples of thermosetting compounds are Dow Corning #306 silicone molding compound, Shenitsu epoxy/silicone transfer molding compound, Morton Chemical Corporation transfer epoxy, and the like.

Receiver contact pins 31 through 38 extend through receiver carrier 10 internal to the cavity formed by spacing boss 50. Emitter contact pins 71 through 78 protrude through emitter carrier 20 within the area defined by spacing boss 60. The receiver and emitter contact pins may be formed from any electrically conductive material, such as copper wire. Receiver carrier 10 includes an inner recess 47 in which receiver chip 40 is mounted. Receiver chip 40 is a conventional semiconductor chip which, by way of example, may be manufactured from silicon, gallium arsenide, lead telluride, or the like. This electronic element detects the presence of radiation (e.g. light) impinging upon it.

Receiver chips, such as receiver chip 40 shown mounted in receiver carrier 10, are used in conjunction with emitter elements such as emitter chip 80 shown mounted in recess 87 of emitter carrier 20. Semiconductor emitter chip 80 may be fabricated, by way of example, from silicon, gallium arsenide, lead telluride, or the like, and functions to emit radiation (e.g. in the form of infrared light) which can be detected by a receiver chip. Receiver chip 40 in receiver carrier 10 is elecrically connected, through wires 41 and 43, to receiver contact pins 32 and 36. Similarly, emitter chip 80 is connected through wires 81 and 83 to emitter contact pins 77 and 73. In this manner, contact points are provided on the outside of the carriers which enable electrical connections to be made to elements mounted therein. As will be explained in more detail below, such electrical contact points enable the emitter and receiver carriers to be adjusted with respect to one another while the emitter and receiver chips are electrically energized, so that the optimum orientation between the chips can be achieved prior to final assembly.

Figure 2:
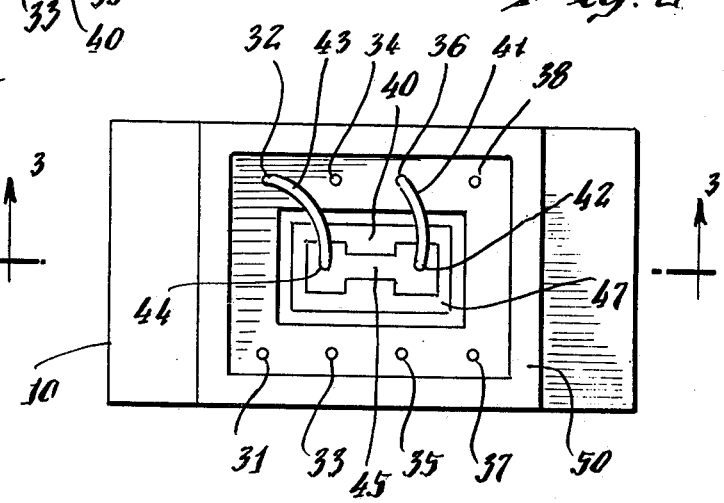
FIG. 2 is a top view of one of the chip carriers shown in FIG. 1.

FIG. 2 shows a top view of receiver carrier 10 having receiver chip 40 mounted therein. Wire 41 is connected to contact point 42 on receiver chip 40. Wire 43 is connected to contact point 44 on receiver chip 40. Active area 45 of receiver chip 40 detects the presence of radiation impinging thereon and provides a signal in response thereto through wires 41 and 43.

Figure 3:
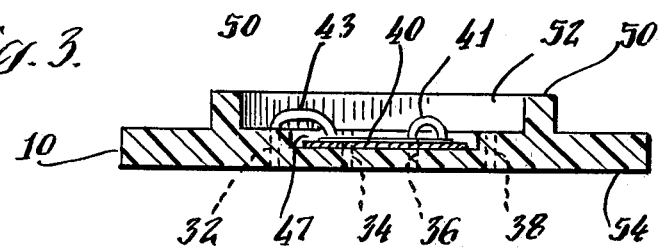
FIG. 3 is a cross-sectional view taken substantially along line 3—3 of FIG. 2.

FIG. 3 shows a cross section of receiver carrier 10 having receiver chip 40 mounted therein, taken substantially along the line 3—3 of FIG. 2. As is clearly shown in FIG. 3, receiver contact pins 32, 34, 36 and 38 extend from the bottom surface of cavity 52 within receiver carrier 10, through receiver carrier 10, to the outside surface 54 of carrier 10. In this way, receiver contact pins 32, 34, 36 and 38 (as well as receiver contact pins 31, 33, 35 and 37, not shown) can be probed from the exterior surface 54 of carrier 10 in order to make electrical contact with receiver chip 40 mounted within recess 47 of receiver carrier 10.

Figure 4:
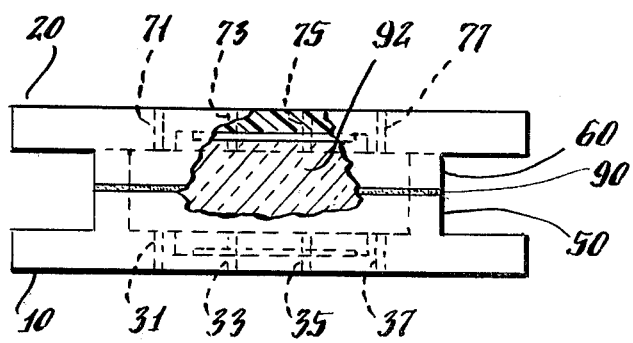
FIG. 4 is a side view of a pair of optocoupler chip carriers assembled in accordance with the present invention.

Once a receiver chip has been mounted within receiver carrier 10, and an emitter chip has been mounted within emitter carrier 20, and appropriate electrical connections have been made between the chips and their respective contact pins, carriers 10 and 20 are brought together as shown in FIG. 4. Before carriers 10 and 20 are permanently secured together, receiver chip 40 is energized and emitter chip 80 is electrically monitored. Carriers 10 and 20 may then be adjusted laterally with respect to one another until the desired emitter output is detected. When the desired optical coupling has thus been achieved, carriers 10 and 20 are permanently secured. As shown in FIG. 4, carrier 10 may be glued to carrier 20 along the perimeters of spacing bosses 50 and 60 by a suitable adhesive 90. One possible adhesive is a cyanoacrylate adhesive such as that marketed under the trademark Eastman 910 by the Eastman Kodak Company.

Spacing boss 50 in receiver carrier 10 and spacing boss 60 in emitter carrier 20 provide a proper spaced relation between receiver chip 40 and emitter chip 80. It will be appreciated that the electrical characteristics of a completed optocoupler formed in accordance with the present invention will, in part, depend upon the spacing between the emitter and receiver chips. Thus, when manufacturing an optocoupler in accordance with the present invention, the height of spacing bosses 50 and 60 will have to be specified in order to obtain a finished optocoupler that performs as desired. The lateral adjustment in accordance with the present invention can, to some extent, compensate for spacing variations such as the height of spacing bosses 50 and 60. For example, if the emitter and receiver chips tend to be too close, a lateral adjustment can be made to decrease the optical coupling between the emitter and receiver chips.

In FIG. 4, a cutaway view is provided through which transparent potting compound 92 can be seen. Compound 92 is optional and may be injected into the cavity formed by the mating of spacing bosses 50 and 60. The potting compound provides a dielectric isolation between the receiver and emitter chips while allowing radiation from the emitter chip to pass therethrough and impinge upon the receiver chip. Transparent potting compound 92 may be any of the commercially available producuts available for such use, such as a silicone compound that can be polymerized by ultraviolet light.

Figure 5:
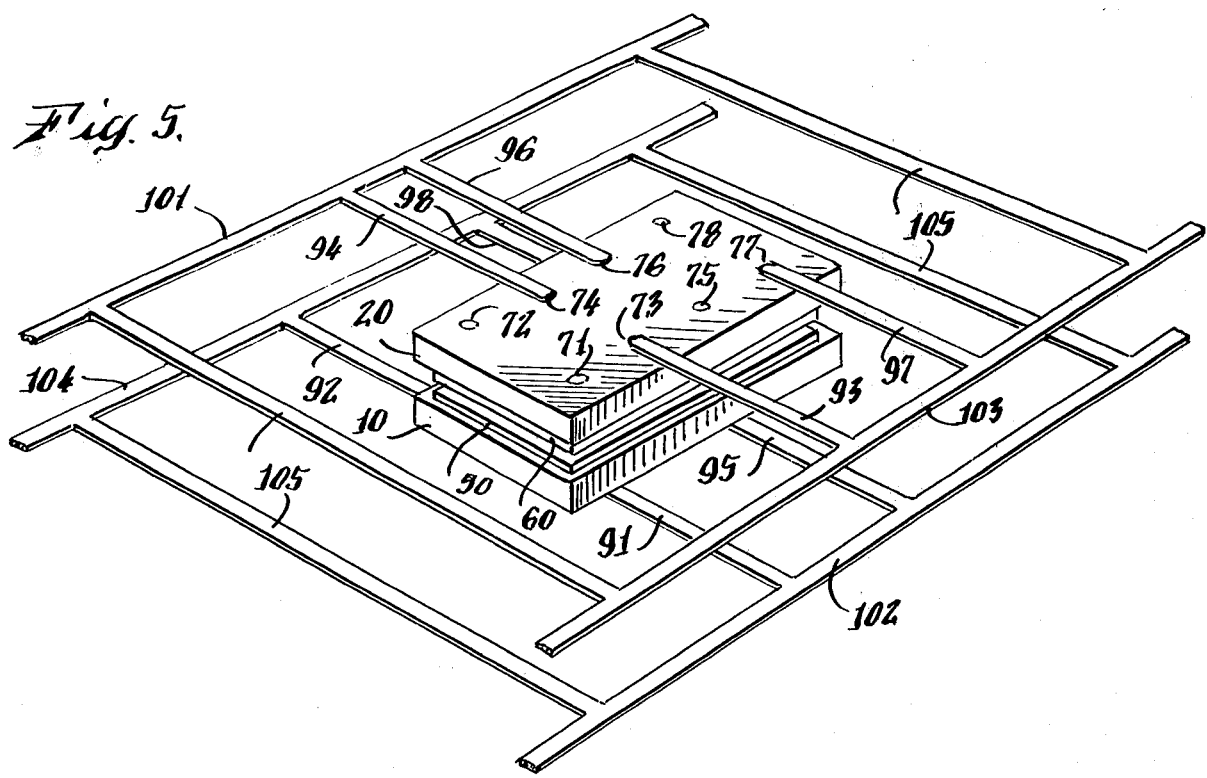
FIG. 5 is a perspective view showing lead frames attached to the assembly of FIG. 4.

Once receiver carrier 10 and emitter carrier 20 have been properly aligned with respect to one another and permanently secured together, leads may be attached thereto prior to assembly of the carriers into a final optocoupler package. One method for attaching such leads is shown in FIG. 5. A lead frame comprising leads 94 and 96 extending from side bar 101, leads 93 and 97 extending from side bar 103, and cross members 105 is provided for use in conjunction with emitter carrier 20. The ends of leads 94, 96, 93, and 97 are soldered to emitter contact pins 74, 76, 73, and 77 respectively. By enabling the lead frame leads to be soldered directly to the contact pins, the present invention provides a simple, economical and reliable method in which final leads can be attached to an optocoupler package. There is no need in the present invention for providing a separate wire bonding operation where additional wires are bonded from leads on the lead frame to contact points on the optocoupler assembly.

As shown in FIG. 5, a similar lead frame comprising leads 92, 98, 91 and 95 along with side bars 102 and 104 and connecting members 105 is provided for receiver carrier 10. After the lead frame leads have been soldered to appropriate contact pins on the receiver and emitter carriers, side bars 101 and 104 and connecting strips 105 are severed from the lead frame so that only the emitter and receiver carrier assembly with individual leads remains.

Figure 6:
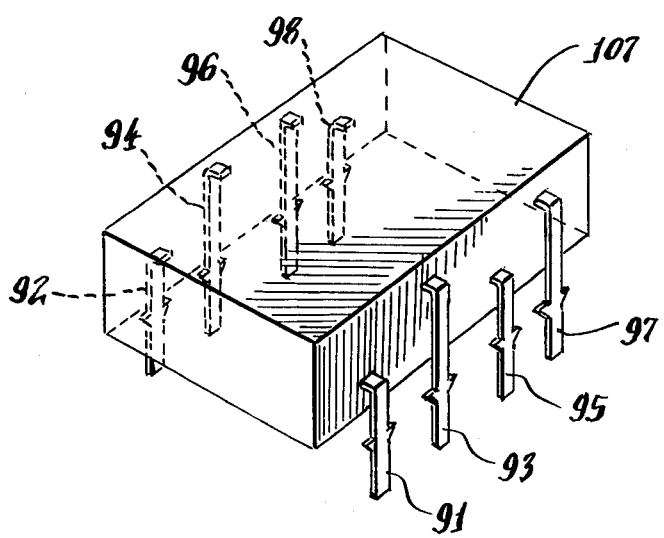
FIG. 6 is a perspective view of a packaged optocoupler in accordance with the present invention.

The leads on the receiver and emitter carrier assembly are then bent at about a 90° angle as shown in FIG. 6, and the assembly is encapsulated into final form. The final package comprises an outer body 107 from which leads 91 through 98 protrude and which surrounds the assembly of receiver carrier 10 and emitter carrier 20.

Outer body 107 is formed from any suitable packaging material, such as plastic or ceramic, the various types of which are well known to those skilled in the art.

The optocoupler assembly of the present invention is particularly well suited to automatic assembly techniques.

In a preferred embodiment, shown in FIG. 7, a plurality of receiver carriers 10 are provided in strip form on carrier strip roll 110. Similarly a plurality of emitter carriers 20 are provided in strip form on carrier strip roll 120. Respective receiver and emitter carriers are brought together as they are unrolled from rolls 110 and 120. Receiver chips are mounted into the receiver carriers and emitter chips are mounted into emitter carriers. By the time respective receiver and emitter carriers arrive at electrical test and orientation station 112, they are adjacent one another with the emitter and receiver chips in operative relation to one another. At electrical test and orientation station 112, test equipment 130, shown in FIG. 8, is connected to appropriate receiver contact pins 32, 36 and emitter contact pins 73, 77. The emitter element is energized and electrical measurements are made at the output of the receiver element. Carriers 10 and 20 can be shifted laterally with respect to one another as designated by double arrows 117 and 119 shown in FIG. 8. Accumulated tolerance factors, such as emitter, light output, receiver sensitivity, chip placement errors, physical carrier dimensions, and the like, can be compensated for in the lateral adjustment process by exercising control over the final orientation of the light source and light detector with respect to one another. Once a proper alignment has been made, as detected by test equipment 130, carriers 10 and 20 are glued together. Cutter blade 114 then severs the assembled receiver and emitter carrier package from the remaining carrier strips. Notches 115 can be provided in the carrier strips to facilitate the handling and cutting of individual carriers from the carrier strips.

Successive emitter and receiver carrier assemblies can be automatically produced at a high rate of speed by using the automated procedure set forth. It will be appreciated by those skilled in the art that more than one receiver and emitter element may be provided within each carrier. The extra contact pins shown in the drawings may be connected to additional receiver and emitter elements within the carriers. The automated test equipment may test and serve as a basis for the automatic alignment of a plurality of receiver and emitter elements within each optocoupler assembly.

While only a single embodiment has been described herein for purposes of illustration, it will be appreciated by those skilled in the art that other variations and modifications could be made thereto. It is intended to cover all of the variations and modifications which fall within the scope of the present invention, as recited in the following claims:

What is claimed is:

1. A process for manufacturing an optocoupler having an emitter element properly oriented with respect to a receiver element, said process comprising the steps of:
   fastening an emitter element to an emitter carrier;
   fastening a receiver element to a receiver carrier;
   positioning said emitter carrier adjacent said receiver carrier with said emitter and receiver elements situated in operative relation;
   electrically monitoring the combined operation of said emitter and receiver elements; and
   adjusting the position of said carriers with respect to one another, until a proper orientation between said emitter and receiver elements has been achieved.

2. The process of claim 1 wherein:
   said emitter element has a plurality of input electrodes;
   said emitter carrier has a plurality of emitter contact pins therein;
   said receiver element has a plurality of output electrodes; and
   said receiver carrier has a plurality of receiver contact pins therein; further comprising the steps of:
   connecting predetermined input electrodes to predetermined emitter contact pins; and
   connecting predetermined output electrodes to predetermined receiver contact pins.

3. The process of claim 2 wherein said monitoring step comprises making electrical connections to said emitter element through said emitter contact pins and to said receiver element through said receiver contact pins.

4. The process of claim 3 further comprising the step of:
   permanently securing said emitter and receiver carriers together when said proper orientation has been achieved.

5. The process of claim 4 further comprising the steps of:
   connecting the leads of a first lead frame to predetermined emitter contact pins on said emitter carrier;
   connecting the leads of a second lead frame to predetermined receiver contact pins on said receiver carrier; and
   encapsulating said emitter and receiver carrier combination to form a final package.

6. The process of claim 5 wherein said lead frame leads are soldered directly to said contact pins.

7. The process of claim 1 or 6 wherein said emitter element is fastened within a cavity on said emitter carrier and said receiver element is fastened within a cavity on said receiver carrier.

8. The process of claim 7 further comprising the step of:
   injecting a transparent filler material within said cavities.

9. A continuous process for manufacturing optocouplers comprising the steps of:
   fastening an emitter element to a first emitter carrier in a strip of such carriers;
   fastening a receiver element to a first receiver carrier in a strip of such carriers;
   bringing said first emitter carrier, while still attached to said strip of emitter carriers, into engagement with said first receiver carrier, while still attached to said strip of receiver carriers, so that said emitter and receiver elements are in operative relation;
   adjusting said first emitter and receiver carriers with respect to one another; and
   electrically monitoring the combined operation of said emitter and receiver elements during said adjusting step to determine when a proper orientation between said elements has been achieved.

10. The process of claim 9 further comprising the step of:
    permanently securing said first emitter carrier to said first receiver carrier when said proper orientation has been achieved.

11. The process of claim 10 further comprising the step of:
    severing the combined first emitter carrier and first receiver carrier from said emitter and receiver carrier strips.

* * * * *